United States Patent
Kim et al.

(10) Patent No.: US 7,781,330 B2
(45) Date of Patent: Aug. 24, 2010

(54) METHOD OF FABRICATING A SEMICONDUCTOR DEVICE COMPRISING HIGH AND LOW DENSITY PATTERNED CONTACTS

(75) Inventors: Chae-Iyoung Kim, Yongin-si (KR); Chang-ki Hong, Seongnam-si (KR); Bo-un Yoon, Seoul (KR); Sung-ho Shin, Yongin-si (KR); Byoung-ho Kwon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 597 days.

(21) Appl. No.: 11/878,508

(22) Filed: Jul. 25, 2007

(65) Prior Publication Data

US 2008/0206985 A1 Aug. 28, 2008

(30) Foreign Application Priority Data

Feb. 28, 2007 (KR) .................... 10-2007-0020576

(51) Int. Cl.
*H01L 21/44* (2006.01)

(52) U.S. Cl. .................. 438/637; 438/947; 438/737; 257/E21.038

(58) Field of Classification Search .................. None
See application file for complete search history.

(56) References Cited

U.S. PATENT DOCUMENTS 6,475,891 B2 * 11/2002 Moon .......................... 438/584
6,955,961 B1 * 10/2005 Chung ......................... 438/241
7,115,525 B2 * 10/2006 Abatchev et al. ............ 438/725
7,449,230 B2 * 11/2008 Sabnis et al. ................ 428/166
2006/0234166 A1 * 10/2006 Lee et al. ..................... 430/313
2008/0076071 A1 * 3/2008 Lim et al. .................... 430/311
2008/0081461 A1 * 4/2008 Lee et al. ..................... 438/637
2008/0124931 A1 * 5/2008 Lee et al. ..................... 438/692

FOREIGN PATENT DOCUMENTS

| KR | 2002-0043862 | 6/2002 |
| KR | 2006-0066392 | 6/2006 |
| KR | 2006-0110097 | 10/2006 |

* cited by examiner

*Primary Examiner*—Thanh V Pham
*Assistant Examiner*—Andres Munoz
(74) *Attorney, Agent, or Firm*—Harness, Dickey & Pierce, P.L.C.

(57) ABSTRACT

Methods of fabricating a semiconductor device is provided. The methods include forming an interlayer insulating layer on a semiconductor substrate having a first region and a second region. First contact plugs may be formed on a portion of the second region to fill a plurality of first contact holes. A plurality of first contact mask layers and a plurality of first dummy mask layers may be formed on the interlayer insulating layer. The first contact mask layers may be formed in the first region. The first dummy mask layers may be formed in the second region. A plurality of second contact mask layers may be formed between two adjacent first contact mask layers. A plurality of second dummy mask layers may be formed between two adjacent first dummy mask layers. The interlayer insulating layer may be etched using the first contact mask layers and the second contact mask layers as etch stop layers to form a plurality of second contact holes through the interlayer insulating layer formed in the first region.

22 Claims, 7 Drawing Sheets

METHOD OF FABRICATING A SEMICONDUCTOR DEVICE COMPRISING HIGH AND LOW DENSITY PATTERNED CONTACTS

PRIORITY STATEMENT

This application claims the benefit of priority under 35 U.S.C. §119 from Korean Patent Application No. 10-2007-0020576, filed on Feb. 28, 2007, in the Korean Intellectual Property Office, the disclosure of which is incorporated herein in its entirety by reference.

BACKGROUND

1. Field

Example embodiments relate to methods of fabricating a semiconductor device. Other example embodiments relate to methods of fabricating a semiconductor device including a contact structure.

2. Description of the Related Art

There has been a desire to increase the integration density of semiconductor devices in order to form finer patterns. Photolithographic processes necessary for forming finer patterns are reaching technical limits. For example, process margins required for a contact structure formed through an interlayer insulating layer are becoming smaller due to the downscaling of a contact structure and a reduction of an interval between contact structures. Conventional photolithographic limitations make it difficult to form a contact structure with finer patterns.

The conventional art acknowledges a method of forming a spacer-type material layer pattern. The method may be used to form protruding finer patterns. It is difficult to form a contact structure using the conventional method of forming a space-type material layer pattern.

The conventional art also acknowledges a method of forming a fine pattern using a double mask layer. In this method, a difference in pattern density between a high-density pattern region and a low-density pattern region may be problematic. For example, subsequent planarization process(es) may be performed at different rates depending on the pattern density such that a step is generated in the contact structure. The reliability of interconnection lines may deteriorate due to the step of the contact structure.

SUMMARY

Example embodiments relate to methods of fabricating a semiconductor device. Other example embodiments relate to methods of fabricating a semiconductor device including a contact structure.

Example embodiments provide a method of fabricating a highly-integrated semiconductor device with a more reliable contact structure.

According to example embodiments, there is provided a method of fabricating a semiconductor device. The method includes forming an interlayer insulating layer on a semiconductor substrate including a first region and a second region. First contact plugs may be formed on (or in) a portion of the second region to fill a plurality of first contact holes. The plurality of first contact holes may be formed through the interlayer insulating layer. A plurality of first contact mask layers and a plurality of first dummy mask layers may be formed on the interlayer insulating layer. The first contact mask layers are formed on (or in) the first region and the first dummy mask layers are formed on (or in) the second region. A plurality of second contact mask layers and a plurality of second dummy mask layers may be formed on the interlayer insulating layer, wherein the second contact mask layers are formed between two adjacent first contact mask layers and the second dummy mask layers are formed between two adjacent first dummy mask layers. A plurality of second contact holes may be formed through the interlayer insulating layer formed on (or in) the first region by etching the interlayer insulating layer using the first contact mask layers and the second contact mask layers as etch protection layers.

According to other example embodiments, there is provided a method of fabricating a semiconductor device. The method includes forming an interlayer insulating layer on a semiconductor substrate including a cell region and a peripheral circuit region. A plurality of first contact plugs may be formed on a portion of the peripheral circuit region to fill a plurality of contact holes. The plurality of contact holes may be formed through the interlayer insulating layer. A plurality of first contact mask layers and a plurality of first dummy mask layers may be formed on the interlayer insulating layer, wherein the first contact mask layers are formed on (or in) the cell region and the first dummy mask layers are formed on (or in) the peripheral circuit region. A mold layer may be formed on the interlayer insulating layer to define a plurality of recesses between two adjacent first contact mask layers and between two adjacent first dummy mask layers. A plurality of second contact mask layers and a plurality of second dummy mask layers may be formed in the recesses. A plurality of second contact holes may be formed through the interlayer insulating layer formed on (or in) the cell region by etching the interlayer insulating layer using the first contact mask layers and the second contact mask layers as etch protection layers. A plurality of second contact plugs may fill the second contact holes.

The first contact mask layers may be formed having the same width and at substantially the same interval as the first dummy mask layers.

The first and second contact plugs, the first and second contact mask layers and the first and second dummy mask layers may be formed of the same material.

The first contact plugs may be formed having a larger width than the second contact plugs.

BRIEF DESCRIPTION OF THE DRAWINGS

Example embodiments will be more clearly understood from the following detailed description taken in conjunction with the accompanying drawings.

FIGS. 1, 3, 5, 7, 9, 11, and 13 are diagrams illustrating plan views of a method of fabricating a semiconductor device according to example embodiments; and FIGS. 2, 4, 6, 8, 10, 12, and 14 are diagrams illustrating cross-sectional views of a method of fabricating a semiconductor device according to example embodiments.

DETAILED DESCRIPTION

Figure 1:
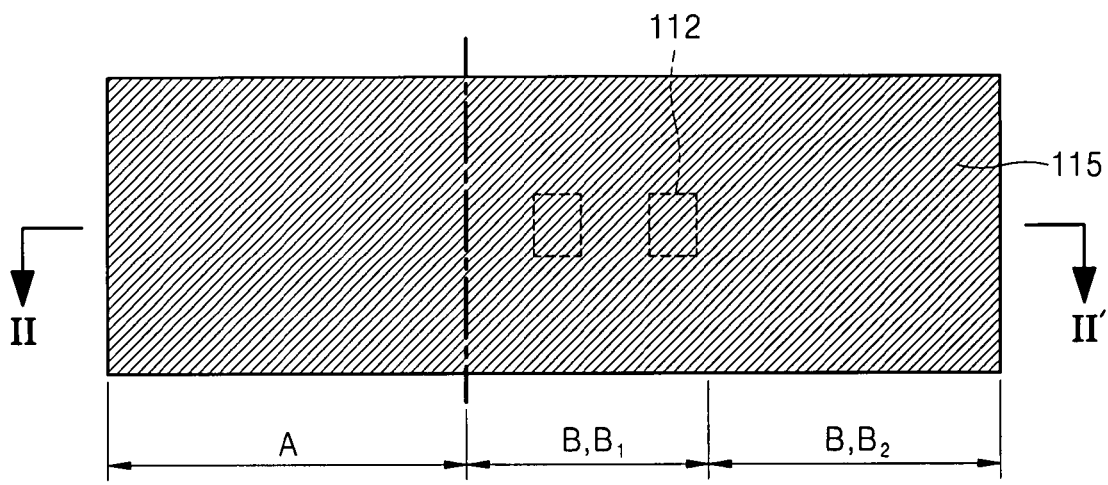
FIGS. 1-14 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while the example embodiments are capable of various modifications and alternative forms, embodiments thereof are shown by way of example in the drawings and will herein be described in detail. It should be understood, however, that there is no intent to limit example embodiments to the particular forms disclosed, but on the contrary, the example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to the example embodiments described.

Example embodiments relate to a method of fabricating a semiconductor device. Other example embodiments relate to a method of fabricating a semiconductor device including a contact structure.

Semiconductor devices according to example embodiments may include a memory device, a logic device, an embedded device or the like in which the memory and logic devices are integrated.

FIGS. 1, 3, 5, 7, 9, 11, and 13 are diagrams illustrating plan views of a method of fabricating a semiconductor device according to example embodiments. FIGS. 2, 4, 6, 8, 10, 12, and 14 are diagrams illustrating cross-sectional views of a method of fabricating a semiconductor device according to example embodiments.

Figure 2:
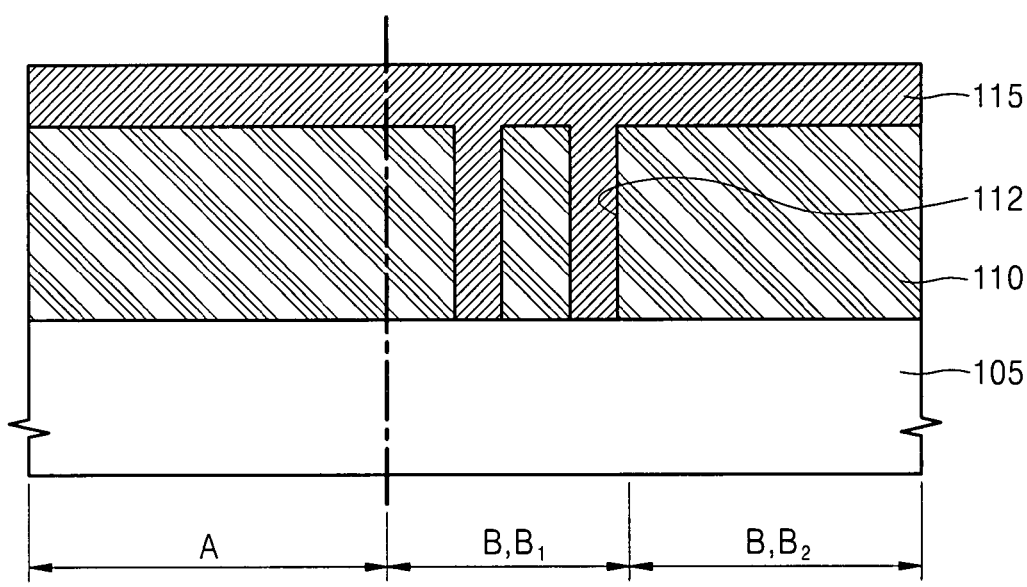

Referring to FIGS. 1 and 2, a semiconductor substrate 105 having a first region A and a second region B is provided. If a semiconductor device is a memory device, then the first region A may be a cell region and the second region B may be a peripheral circuit region. A transistor and/or a capacitor array may be disposed (or formed) in the cell region to store data. A driving circuit required for inputting and outputting data may be formed (or disposed) in the peripheral circuit region.

The second region B may be divided into a first portion B1 where a plurality of first contact plugs 115c (refer to FIG. 14) will be formed and a second portion B2. A plurality of second contact plugs 150a (refer to FIG. 14) will be arranged on (or in) the first region A. The second contact plugs 150a may be formed at a higher density than the first contact plugs 150c. The first region A may be referred to as a high-density region and the second region B may be referred to as a low-density region.

An interlayer insulating layer 110 may be formed on the semiconductor substrate 105. The interlayer insulating layer 110 may be formed to insulate an interconnection line from a device formed (or disposed) on the semiconductor substrate 105. The interlayer insulating layer 110 may include an oxide layer, a nitride layer and/or a high-k dielectric layer. The high-k dielectric layer may refer to an insulating layer having a higher dielectric constant than each of the oxide layer and the nitride layer.

A plurality of first contact holes 112 may be formed in the interlayer insulating layer 110 on the first portion B1 of the second region B. The first contact holes 112 may be formed using photolithographic and etching processes known in the art. The first contact holes 112 may be formed at a low-density region. The first contact holes 112 may not be formed with finer patterns. The first contact holes 112 may be formed having a larger width and/or at larger interval(s) than second contact holes 145 (refer to FIG. 10) that will be formed on the first region A. In FIGS. 1 and 2, two first contact holes 112 are exemplarily illustrated, but the embodiments are not limited thereto. For example, the number of the first contact holes 112 may be selected according to the type of semiconductor device.

The first contact holes 112 may be formed prior to forming first and second dummy masks 115b and 135b that will be described later. In comparison to forming the first and second dummy masks 115b and 135b prior to forming the first contact holes 112, a focus margin may increase during a photolithographic process performed to form the first contact holes 112. If the first and second dummy mask layers 115b and 135b are formed adjacent to the first contact holes 112, defocus is likely to occur during the formation of the first contact holes 112.

A first conductive layer 115 may be formed on the interlayer insulating layer 110 to fill the first contact holes 112. The first conductive layer 115 may include polysilicon or a metal. The first conductive layer 115 may be formed using a chemical vapor deposition (CVD) process.

Figure 3:
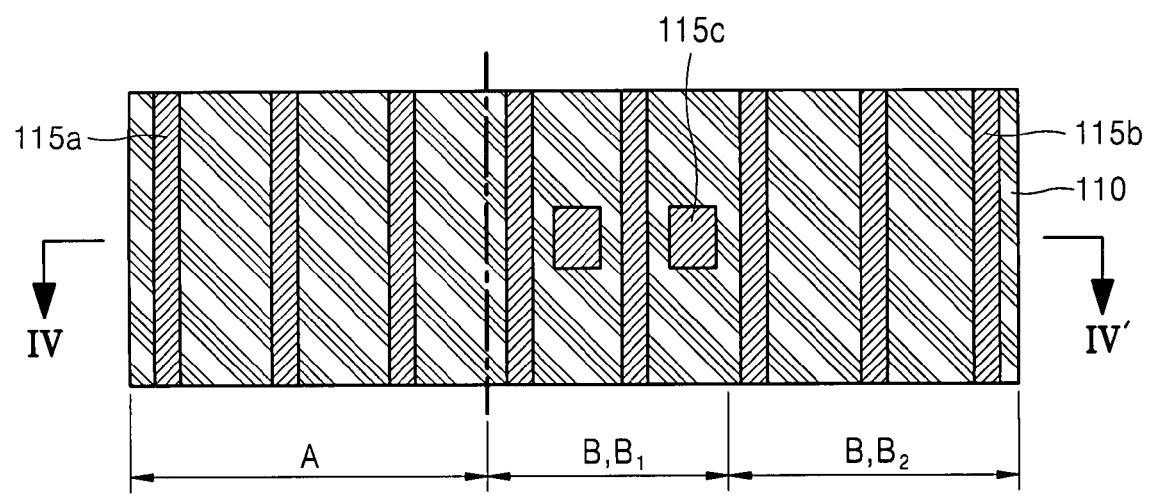
Figure 4:
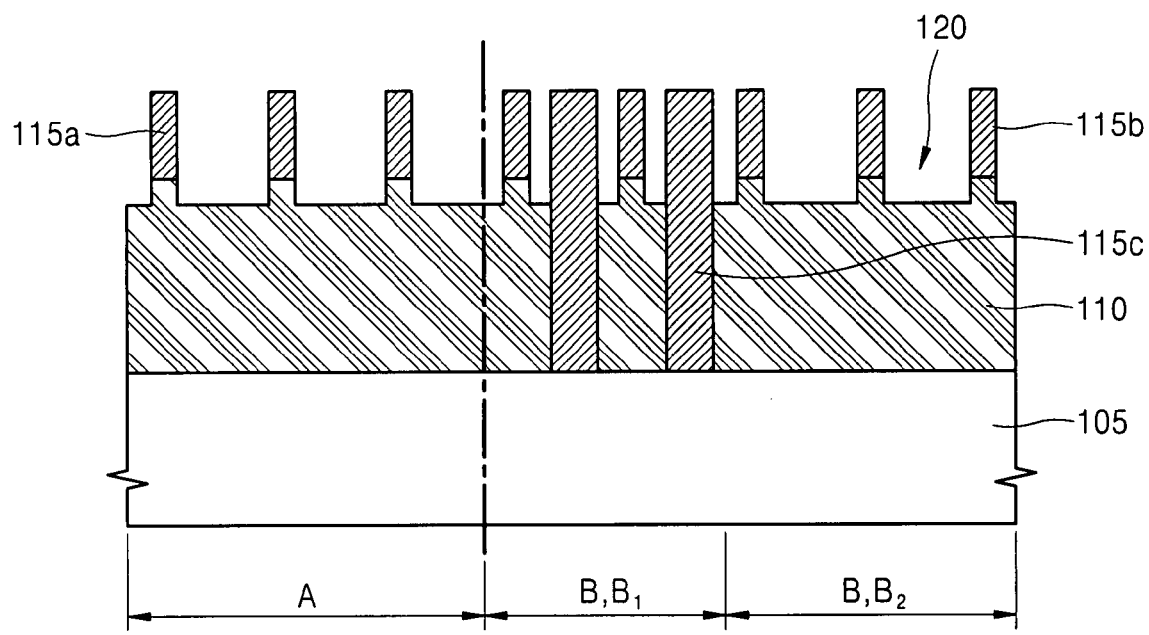

Referring to FIGS. 3 and 4, a plurality of first contact mask layers 115a, a plurality of first dummy mask layers 115b and a plurality of first contact plugs 115c may be formed on the interlayer insulating layer 110. The first contact mask layers 115a may be formed on (or in) the first region A. The first dummy mask layers 115b may be formed on (or in) the second region B. The first contact plugs 115c may be formed on (or in) the first portion B1 of the second region B.

The arrangement of the first contact mask layers 115a, the first dummy mask layers 115b and the first contact plugs 115c may be selected according to the type of semiconductor device. Each of the first contact mask layers 115a and the first dummy mask layers 115b may be arranged as a line type. Although FIGS. 3 and 4 illustrate the first dummy mask layers 115b spaced apart from the first contact plugs 115c, example embodiments are not limited thereto. The first dummy mask layers 115b may be connected to the first contact plugs 115c and/or overlap with the first contact plugs 115c.

The first contact mask layers 115a may function to define portions of second contact holes 145 (refer to FIG. 10) that will be formed later. The first dummy mask layers 115b may be formed to substantially similar to (or equalize) the pattern density of the first region A of the second region B. The first contact mask layers 115a may be formed having a substantially similar width and/or at substantially similar interval(s) as the first dummy mask layers 115b. The first contact mask layers 115a may be formed having the same width and/or at the same (or substantially similar) interval(s) as the first dummy mask layers 115b.

The first contact mask layers 115a, the first dummy mask layers 115b and the first contact plugs 115c may be formed simultaneously by patterning the first conductive layer 115. The number of operation process may be reduced, economizing time and fabrication costs.

According to example embodiments, the first contact mask layers 115a, the first dummy mask layers 115b and the first contact plugs 115c may be formed in arbitrary order. The first contact mask layers 115a, the first dummy mask layers 115b and the first contact plugs 115c may be formed of different materials.

Grooves 120 may be formed by etching the interlayer insulating layer 110, which is exposed by the first contact mask layers 115a, the first dummy mask layers 115b and the first contact plugs 115c to a desired thickness. The grooves 120 may be provided to allow the bottom surfaces of the first contact mask layers 115 to form a planar surface with the bottom surfaces of second contact mask layers 135a (refer to FIG. 8).

Figure 5:
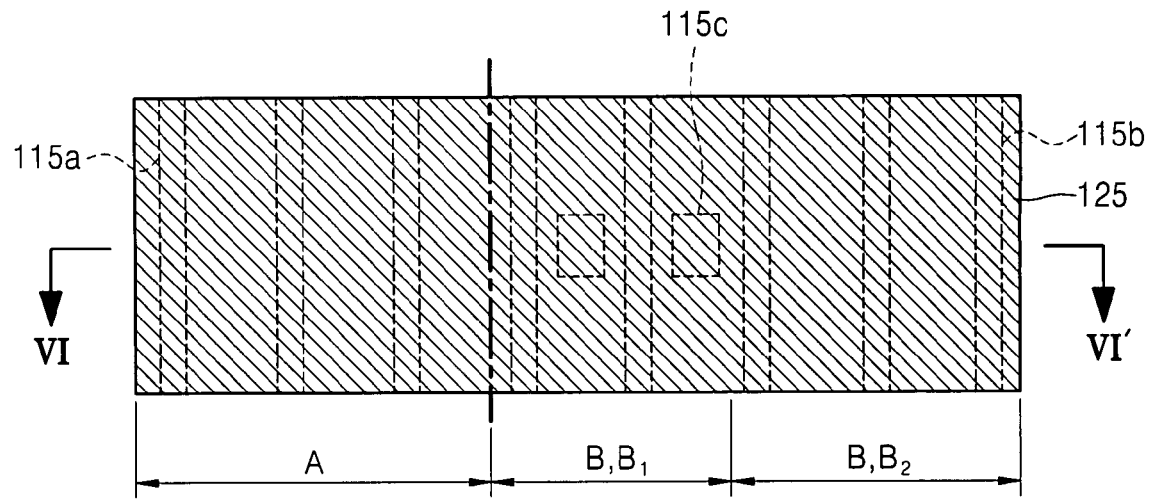
Figure 6:
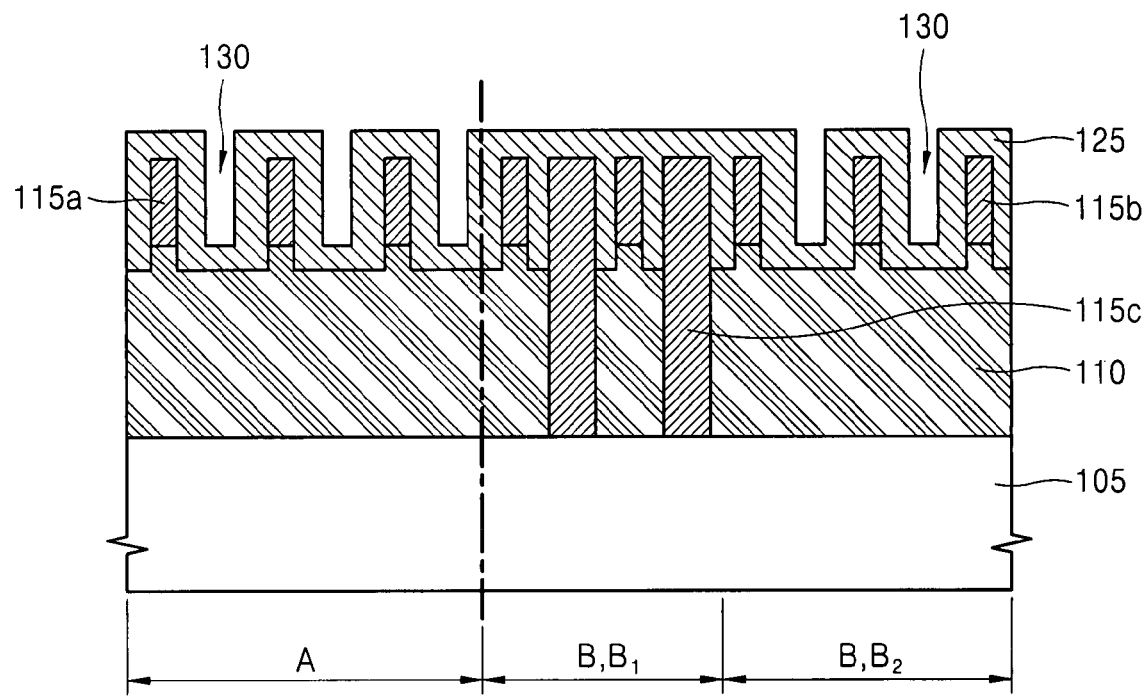

Referring to FIGS. 5 and 6, a mold layer 125 may be formed to enclose the first contact mask layers 115a and the first dummy mask layers 115b. A plurality of recesses 130 may be defined by the mold layer 125 between two adjacent first contact mask layers 115a and between two adjacent first dummy mask layers 115b.

The thickness of the mold layer 125 may determine the width of the recesses 130. The thickness of the mold layer 125 may be equal to (or substantially similar as) the depth of the groove 120. The bottom surfaces of the recesses 130 may form a planar surface with the bottom surfaces of the first contact mask layers 115a. The mold layer 125 may be formed using an atomic layer deposition (ALD) process under that the thickness of the mold layer 125 may be more easily controlled.

The mold layer 125 may be formed of a material having an etch selectivity with respect to the first contact mask layers 115a. The mold layer 125 may be an insulating layer (e.g., an oxide layer).

Figure 7:
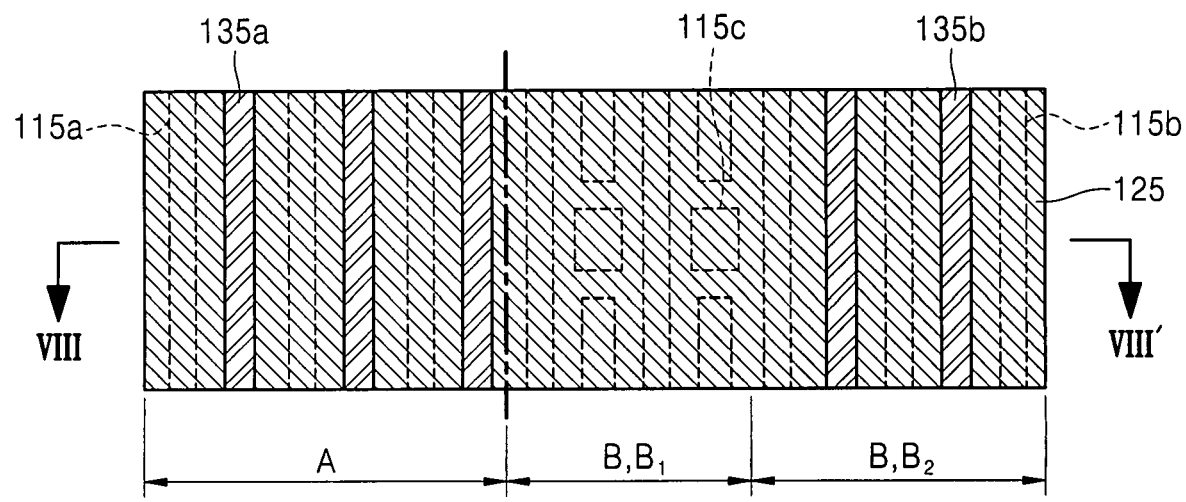
Figure 8:
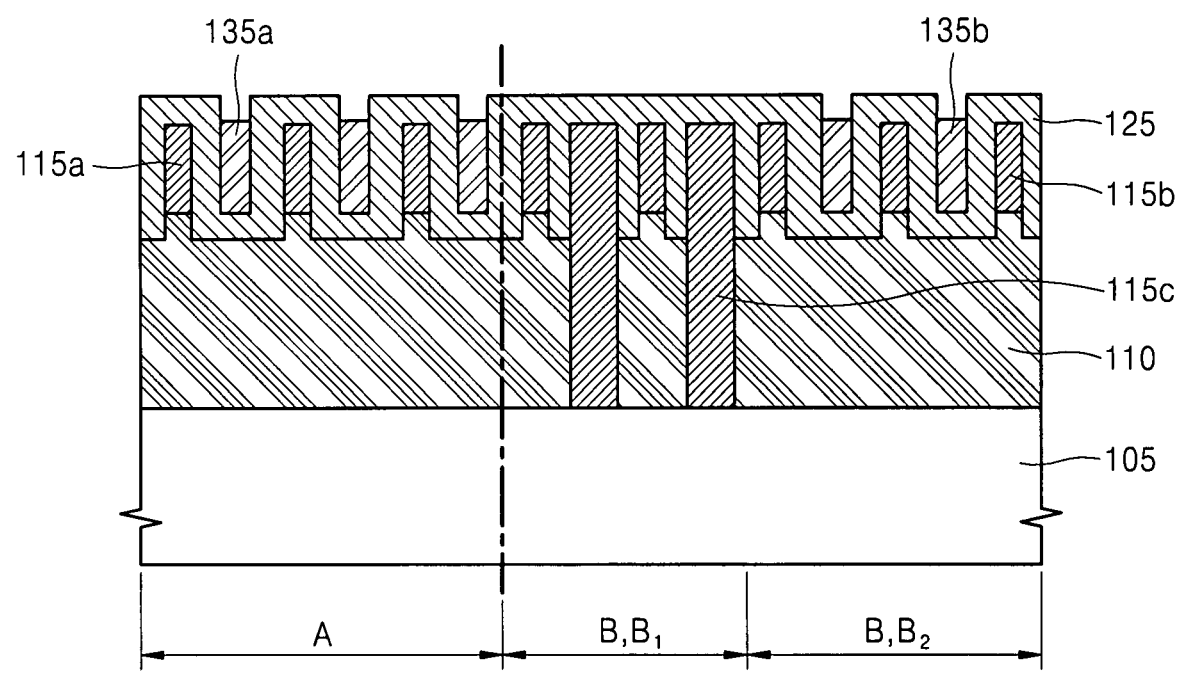

Referring to FIGS. 7 and 8, a plurality of second contact mask layers 135a and a plurality of second dummy mask layers 135b may be formed in the recesses 130. The second contact mask layers 135a may be formed on (or in) the first region A. The second dummy mask layers 135b may be formed on (or in) the second region B.

A second conductive layer (not shown) may be formed on the mold layer 125 filling the recesses 130. The second conductive layer may be planarized to form the second contact mask layers 135a and the second dummy mask layers 135b, which are insulated from each another. The second conductive layer may be planarized using an etchback process, a chemical mechanical polishing (CMP) process or similar process.

The second contact mask layers 135a may be self-aligned with the first contact mask layers 115a and the mold layer 125 without using a photolithographic process. The position of the second contact mask layers 135a is not restricted by photolithographic limitations but may be controlled by the thickness of the mold layer 125.

Because the depth of the groove 120 is equal to (or substantially similar) to the thickness of the mold layer 125, the bottom surfaces of the first contact mask layers 115a may form a planar surface with the bottom surfaces of the second contact mask layers 135a. The second conductive layer may be further etched to a desired thickness during the planarization process in order that the first contact mask layers 115a may be formed at about the same level as the second contact mask layers 135a. The first and second contact mask layers 115a and 135a may be more effectively used as etch protection layers.

The second conductive layer may be formed of a material having an etch selectivity with respect to the mold layer 125 and the interlayer insulating layer 110. The second conductive layer may include polysilicon or a metal. The first contact mask layer 115a, the second contact mask layer 135a, the first dummy mask layer 115b and the second dummy mask layer 135b may be formed of the same material.

Figure 9:
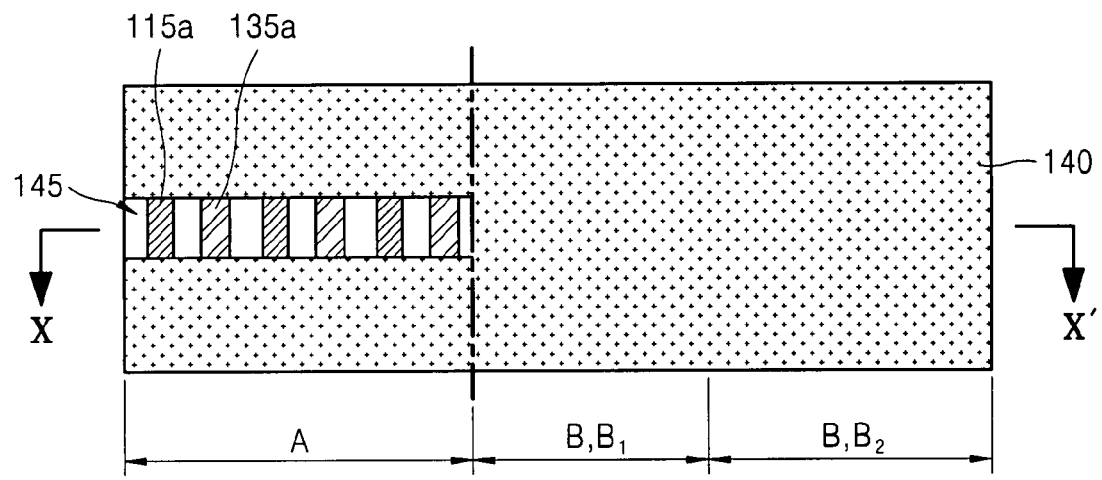
Figure 10:
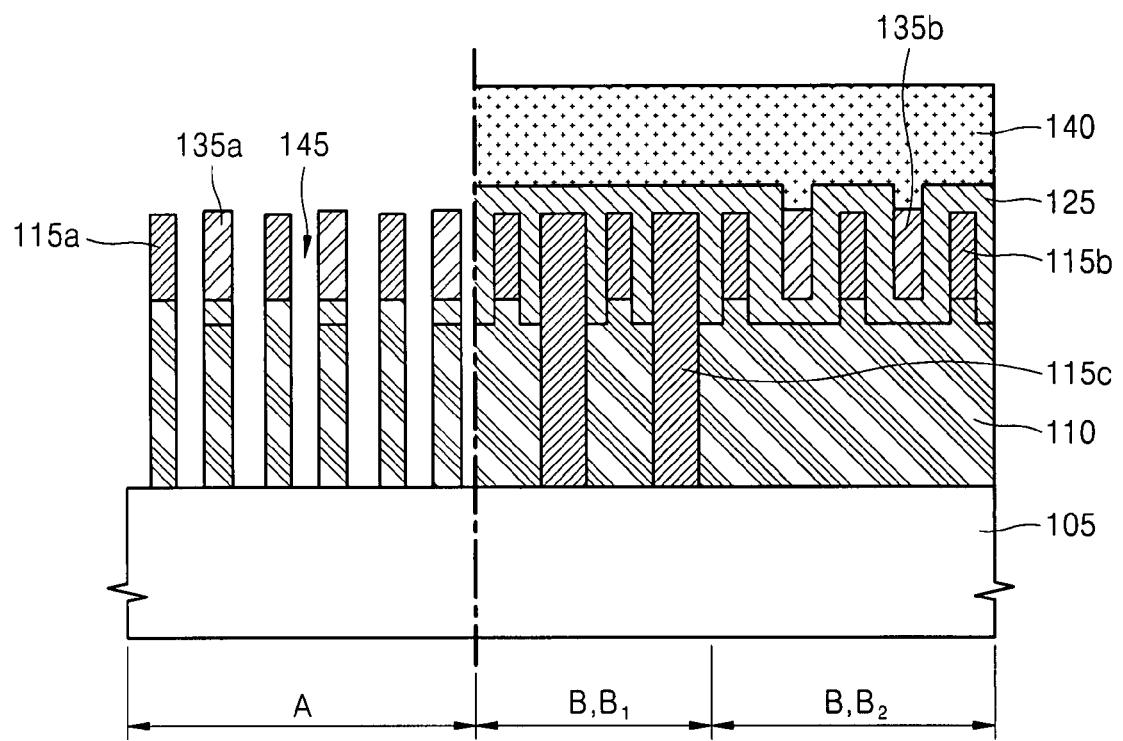

Referring to FIGS. 9 and 10, a third contact mask layer 140 may be formed on the mold layer 125 over the second region B. The third contact mask may expose a portion of the first region A. The third contact mask layer 140 may be a photoresist layer formed using a photolithographic process known in the art.

The interlayer insulating layer 110 and the mold layer 125, which is exposed by the third contact mask layer 140, may be etched. The third contact mask layer 140, the first contact mask layer 115a and the second contact mask layer 135a may be used as etch protection layers. A plurality of second contact holes 145 may be formed through the interlayer insulating layer 110 between the first contact mask layers 115a and the second contact mask layers 135a.

The width of the second contact holes 145 may be determined by the distance between the first contact mask layer 115a and the second contact mask layer 135a (i.e., the thickness of the mold layer 125). The use of an ALD technique allows for control of the thickness of the mold layer 125 below the resolution limit under normal photolithographic conditions. The width of the second contact holes 145 may be controlled below the resolution limit under normal photolithographic conditions in order that the second contact holes 145 may be formed at a higher density.

Figure 11:
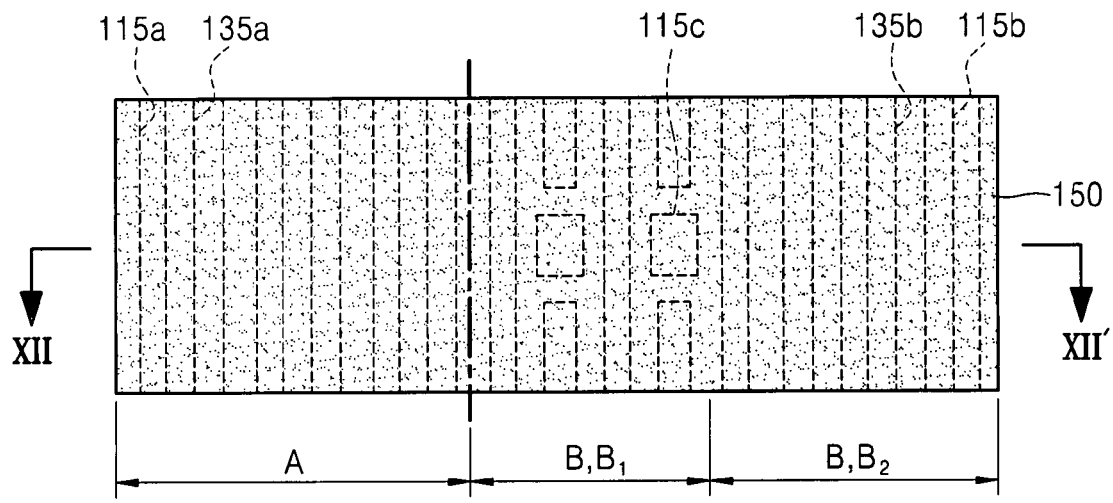
Figure 12:
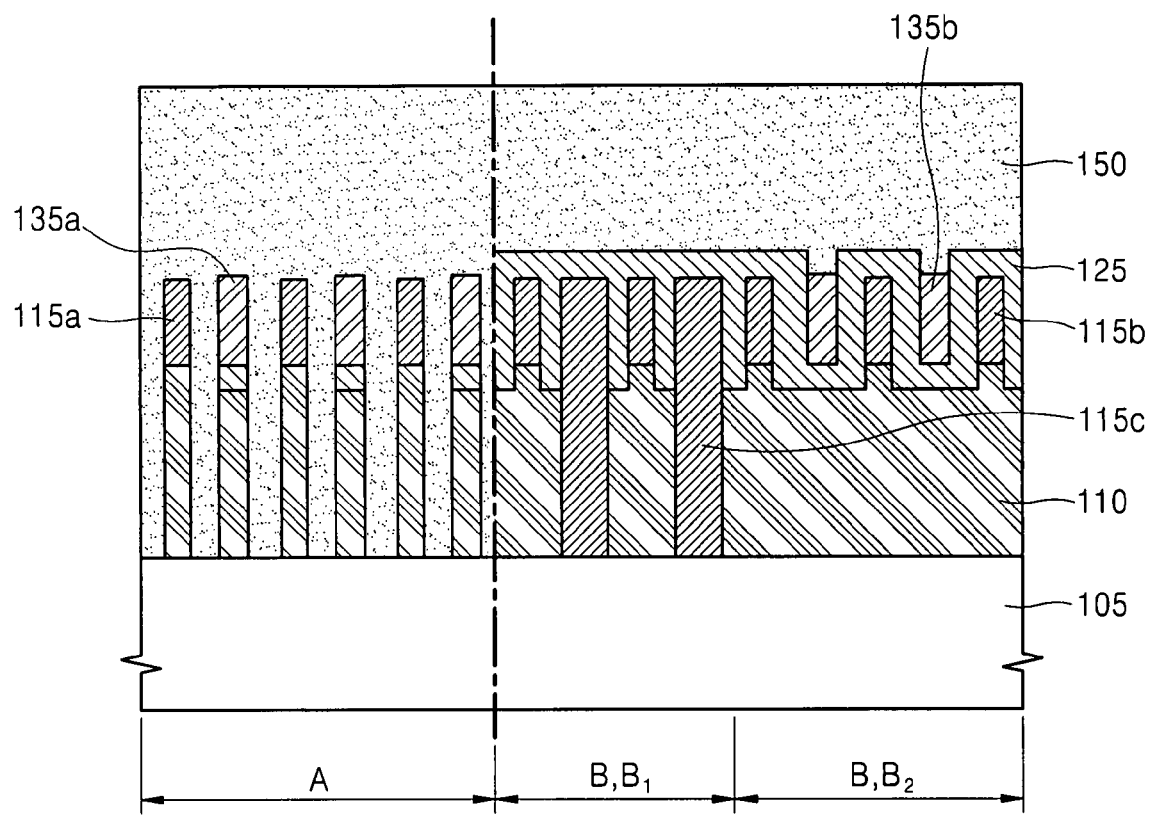

Referring to FIGS. 11 and 12, the third contact mask layer 140 may be removed. A third conductive layer 150 may formed on the semiconductor substrate 105 to fill the second contact holes 145. The third conductive layer 150 may include polysilicon or a metal formed by a CVD process.

Figure 13:
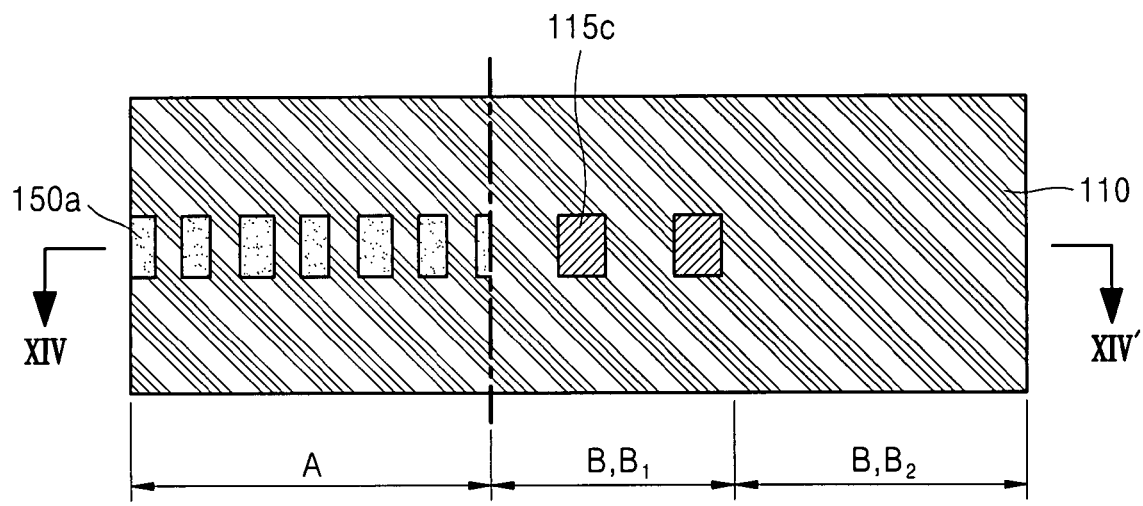
Figure 14:
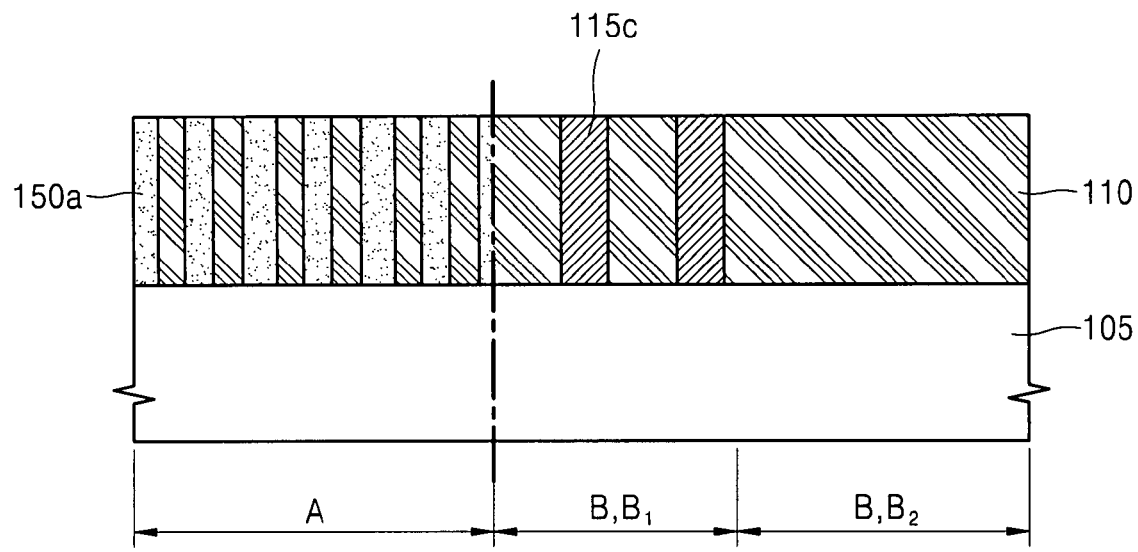

Referring to FIGS. 13 and 14, the third conductive layer 150 may be planarized to define the second contact plugs 150a in the second contact holes 145. The third conductive layer 150 may be further planarized until the first contact mask layer 115a, the second contact mask layer 130a, the first dummy mask layer 115b, the second dummy mask layer 130b and the mold layer 125 are removed.

The third conductive layer 150, the first contact mask layer 115a, the second contact mask layer 130a, the first dummy mask layer 115b, the second dummy mask layer 130b and the mold layer 125 may be planarized until the interlayer insulating layer 110 is exposed. The planarization process may be performed using an etchback process or a CMP process. The first contact mask layer 115a, the second contact mask layer 130a, the first dummy mask layer 115b, the second dummy mask layer 130b, the first contact plug 115c and the second contact plug 130c may be formed of the same material to facilitate the planarization process.

The first dummy mask layer 115b and the second dummy mask layer 130b may function to prevent (or reduce) the likelihood of a step being generated in the interlayer insulating layer 110 between the first region A and the second region B. The first contact mask layer 115a and the second contact mask layer 130a are formed on (or in) the first region A at substantially the same pattern density as the first dummy mask layer 115b and the second dummy mask layer 130b formed on (or in) the second region B, inhibiting (or reducing) the likelihood of dishing occurring due to a difference in polishing rate between the first region A and the second region B. The third contact plugs 115c may not affect the pattern density of the second region B because the third contact plugs 115c have smaller areas.

According to example embodiments, the first dummy mask layer 115b and the second dummy mask layer 130b may be formed on the first portion B1 of the second region B where the first contact plugs 115c are formed. A step may not occur in the interlayer insulating layer 110 between the first portion B1 and the second portion of the second region B irrespective of whether the first contact plugs 115c are formed or not.

After performing the above method, the semiconductor device may undergo subsequent processes as known to one of ordinary skill in the art. For example, a bit line electrode or a word line electrode (not shown) may be formed on the second contact plugs 150a. The second contact plugs 150a may connect the bit line electrode or the word line electrode to a transistor (not shown) formed on the semiconductor substrate 105. The first contact plugs 115c may be formed having a larger width and/or at larger interval(s) than the second contact plugs 15.

According to example embodiments, second contact plugs may be formed with a finer pattern at higher density using first contact mask layers and second contact mask layers that are self-aligned to each other.

Contact plugs may be formed without generating a step between a high-density region and a low-density region.

A sufficient focus margin may be obtained by forming low-density contact plugs in advance. As such, more reliable high-density contact plugs and the low-density contact plugs may be formed.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of fabricating a semiconductor device, comprising:
    forming an interlayer insulating layer on a semiconductor substrate including a first region and a second region;
    forming first contact plugs on a portion of the second region to fill a plurality of first contact holes formed through the interlayer insulating layer;

forming a plurality of first contact mask layers and a plurality of first dummy mask layers on the interlayer insulating layer, wherein the plurality of first contact mask layers are formed in the first region and the plurality of first dummy mask layers are formed in the second region;

forming a plurality of second contact mask layers and a plurality of second dummy mask layers, wherein each of the plurality of second contact mask layers are formed between two of the plurality of first contact mask layers that are adjacent and each of the second dummy mask layers are formed between two of the plurality of first dummy mask layers that are adjacent; and forming a plurality of second contact holes through the interlayer insulating layer formed in the first region by etching the interlayer insulating layer using the plurality of first contact mask layers and the plurality of second contact mask layers as etch protection layers.

2. The method of claim 1, wherein the plurality of second contact mask layers and the plurality of second dummy mask layers are formed on the interlayer insulating layer.

3. The method of claim 2, wherein the plurality of first contact mask layers and the plurality of first dummy mask layers are formed simultaneously.

4. The method of claim 3, wherein forming the plurality of first contact plugs, the plurality of first contact mask layers and the plurality of first dummy mask layers includes patterning a first conductive layer.

5. The method of claim 4, wherein the first conductive layer includes polysilicon.

6. The method of claim 2, wherein the plurality of first contact mask layers are formed having substantially the same width and at substantially the same interval as the plurality of first dummy mask layers.

7. The method of claim 2, wherein forming the plurality of second contact mask layers and the plurality of second dummy mask layers includes:
    forming a mold layer on the interlayer insulating layer to define a plurality of recesses between each of the plurality of first contact mask layers that are adjacent and between each of the plurality of first dummy mask layers that are adjacent; and
    forming a second conductive layer in the plurality of recesses.

8. The method of claim 7, further comprising forming grooves by etching the interlayer insulating layer exposed by the plurality of first contact plugs, the plurality of first contact mask layers and the plurality of first dummy mask layers to a desired thickness, prior to forming the mold layer.

9. The method of claim 7, wherein a thickness of the mold layer determines a width of each of the plurality of second contact holes.

10. The method of claim 7, wherein the mold layer and the interlayer insulating layer each include an oxide layer.

11. The method of claim 7, wherein the second conductive layer includes polysilicon.

12. The method of claim 2, further comprising filling the plurality of second contact holes with a plurality of second contact plugs, after forming the plurality of second contact holes.

13. The method of claim 12, wherein the plurality of first contact plugs, the plurality of second contact plugs, the plurality of first contact mask layers, the plurality of second contact mask layers, the plurality of first dummy mask layers and the plurality of second dummy mask layers are formed of the same material.

14. The method of claim 12, wherein the plurality of first contact plugs are formed having a larger width than the plurality of second contact plugs.

15. The method of claim 12, wherein forming of the second contact plugs includes:
    forming a third conductive layer on the semiconductor substrate filling the plurality of second contact holes; and
    planarizing the third conductive layer.

16. The method of claim 15, wherein planarizing the third conductive layer includes simultaneously removing the plurality of first contact mask layers, the plurality of first dummy mask layers, the plurality of second contact mask layers and the plurality of second dummy mask layers.

17. The method of claim 15, wherein the third conductive layer includes polysilicon.

18. The method of claim 2, wherein the first region is a cell region, and the second region is a peripheral circuit region.

19. The method of claim 1, further comprising:
    forming a mold layer on the interlayer insulating layer to define a plurality of recesses between each of the plurality of first contact mask layers that are adjacent and between each of the plurality of first dummy mask layers that are adjacent; and
    forming a plurality of second contact plugs filling the second contact holes,
    wherein the first region is a cell region and the second region is a peripheral circuit region, and
    the plurality of second contact mask layers and the plurality of second dummy mask layers are formed in the plurality of recesses.

20. The method of claim 19, wherein the plurality of first contact mask layers are formed having the same width and at substantially the same interval as the plurality of first dummy mask layers.

21. The method of claim 19, wherein the plurality of first contact plugs, the plurality of second contact plugs, the plurality of first contact mask layers, the plurality of second contact mask layers, the plurality of first dummy mask layers and the plurality of second dummy mask layers are formed of the same material.

22. The method of claim 19, wherein the plurality of first contact plugs are formed having a larger width than the plurality of second contact plugs.

* * * * *

UNITED STATES PATENT AND TRADEMARK OFFICE
CERTIFICATE OF CORRECTION

PATENT NO. : 7,781,330 B2  Page 1 of 1
APPLICATION NO. : 11/878508
DATED : August 24, 2010
INVENTOR(S) : Chae-lyoung Kim et al.

It is certified that error appears in the above-identified patent and that said Letters Patent is hereby corrected as shown below:

Title page, Item (75) Inventors, should read

Chae-lyoung Kim, Yongin-si (KR);

Chang-ki Hong, Seongnam-si (KR);

Bo-un Yoon, Seoul (KR);

Sung-ho Shin, Yongin-si (KR);

Byoung-ho Kwon, Suwon-si (KR)

Signed and Sealed this

Thirtieth Day of November, 2010

David J. Kappos
*Director of the United States Patent and Trademark Office*